(12) United States Patent
Suhas et al.

(10) Patent No.: US 9,343,181 B2
(45) Date of Patent: May 17, 2016

(54) MEMORY MODULE ERRORS

(71) Applicant: HEWLETT-PACKARD DEVELOPMENT COMPANY, L.P., Houston, TX (US)

(72) Inventors: Shivanna Suhas, Bangalore (IN); Ramaiah Mahesh, Bangalore (IN); Suresh Brinda Yelandur, Bangalore (IN); Malhotra Sunil, Bangalore (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 195 days.

(21) Appl. No.: 14/015,758

(22) Filed: Aug. 30, 2013

(65) Prior Publication Data

US 2015/0067420 A1    Mar. 5, 2015

(51) Int. Cl.
G06F 12/06    (2006.01)
G06F 11/22    (2006.01)
G11C 29/10    (2006.01)
G11C 29/08    (2006.01)
G11C 29/44    (2006.01)
G11C 29/52    (2006.01)
G11C 29/00    (2006.01)
G11C 5/04    (2006.01)
G11C 29/04    (2006.01)

(52) U.S. Cl.
CPC ............ G11C 29/10 (2013.01); G06F 11/2252 (2013.01); G06F 11/2284 (2013.01); G06F 12/0646 (2013.01); G11C 29/08 (2013.01); G11C 29/44 (2013.01); G11C 29/52 (2013.01); G11C 29/883 (2013.01); *G11C 5/04* (2013.01); *G11C 2029/0401* (2013.01); *G11C 2029/0407* (2013.01); *G11C 2029/0409* (2013.01)

(58) Field of Classification Search
CPC ........ G11C 29/08; G11C 29/44; G11C 29/52; G06F 11/006; G06F 11/22; G06F 11/2252; G06F 11/2284; G06F 12/0646
See application file for complete search history.

(56) References Cited

U.S. PATENT DOCUMENTS

| | | | |
|---|---|---|---|
| 7,555,677 B1 * | 6/2009 | Wiley et al. | 714/36 |
| 8,041,990 B2 | 10/2011 | O'Connor et al. | |
| 8,140,942 B2 | 3/2012 | Dell et al. | |
| 8,255,740 B2 | 8/2012 | Kamath et al. | |
| 2008/0098277 A1 * | 4/2008 | Hazelzet | 714/753 |
| 2010/0107010 A1 * | 4/2010 | Warnes et al. | 714/36 |
| 2011/0138219 A1 | 6/2011 | Walton et al. | |
| 2012/0011402 A1 * | 1/2012 | Chen et al. | 714/25 |
| 2013/0138901 A1 * | 5/2013 | Cordero et al. | 711/162 |
| 2014/0164853 A1 * | 6/2014 | Cordero et al. | 714/718 |

OTHER PUBLICATIONS

Dell; Dell™ Reliable Memory Technology Detecting and isolating memory errors; Http://www.dell.com/downloads/global/products/precn/en/dell-precision-workstation-reliable-memory-technology-whitepaper.pdf >; Apr. 2012.

* cited by examiner

*Primary Examiner* — Hal Schnee
(74) *Attorney, Agent, or Firm* — Hewlett Packard Enterprise Patent Department

(57) ABSTRACT

Techniques for handling errors on memory modules are provided. An uncorrected error from a pair of memory modules may be received. Memory modules other than the pair of memory modules producing the error may be de-configured. Diagnostic tests may be run on the faded pair of memory modules. The memory module of the pair of memory modules that caused the uncorrected error may be determined.

15 Claims, 5 Drawing Sheets

MEMORY MODULE ERRORS

BACKGROUND

Modern data centers may contain tens of thousands server computers. Each of these server computers may have associated storage, such as hard drives and optical drives. Each server may also have associated memory, such as memory provided on Dual In-line Memory Modules (DIMM). In addition, each server may have associated fans, power supplies, network interface cards, terminal connections, and any number of other associated devices.

When server hardware errors occur, it may take a skilled technician a long time to identify the source of the error. To reduce the need for skilled technicians, automated diagnostic tools may allow the server itself to identify a component that needs to be replaced. Such a component is often referred to as a field replaceable unit (FRU). The automated tool identifies a potentially faulty component, and a relatively unskilled technician may replace the faulty component.

DETAILED DESCRIPTION

Use of automated tools to identify errors in FRUs has decreased the need for highly paid, skilled technicians, to diagnose and rectify server hardware failures. An automated tool may run diagnostic tests on the server, and based on the results of those tests, may determine the FRU that is to be replaced. For example, an automated tool may determine that a hard drive within a server has failed. The tool may recommend that the hard drive be replaced. At that point, a relatively cheap, less skilled technician may be employed to simply replace the identified component. The skill level needed by the technician is reduced, because the technician is not used to diagnose the problem, but rather to simply replace the FRU.

The techniques described above are effective when the diagnostic tools are able to identify an error down to a specific FRU. However a problem arises with certain components, when an error cannot be isolated to a single FRU. For example, sever computers typically have memory in the form of DIMMs. The DIMMs are generally paired for reading/writing cachelines of data. Thus when a memory error occurs, the error is associated with the DIMM pair, as opposed to the individual DIMM that was the source of the error. As such, automated diagnostic tools may recommend replacement of the DIMM pair, even though only one DIMM of the pair may be faulty.

Replacement of a good DIMM along with a bad DIMM leads to excessive costs. First, the technician must obtain two DIMMs, instead of one, which has a cost. In addition, if the DIMMs are to be returned to the manufacturer for warranty or other purposes, twice the number of faulty DIMMs are returned, because for each pair, one of the DIMMs likely has no problems. The manufacturer then may need to expend resources to discover which of the returned pair of DIMMs actually contains a fault.

The techniques described herein overcome this problem by performing diagnostic tests on DIMM pairs that are able to identify an individual DIMM that is causing an error. The memory that makes up the DIMM is subjected to exhaustive tests that are able to identify faults on individual chips that make up the DIMMs. These tests are normally too time consuming to run on all of the DIMMs within a server as part of a normal boot process. In order to overcome this problem, DIMM pairs that are not experiencing errors are temporarily de-configured, such that they do not participate in the boot process. In addition, the server is configured to boot in a quick boot mode, which only enables functionality needed to perform the exhaustive tests on the configured DIMMs. In some implementations, if the exhaustive diagnostic tests are not able to determine the faulty DIMM, a historical list of errors may be used to identify which DIMM of the DIMM pair is the probable cause of the error. These techniques are described in more detail below and in conjunction with the appended figures.

Figure 1:
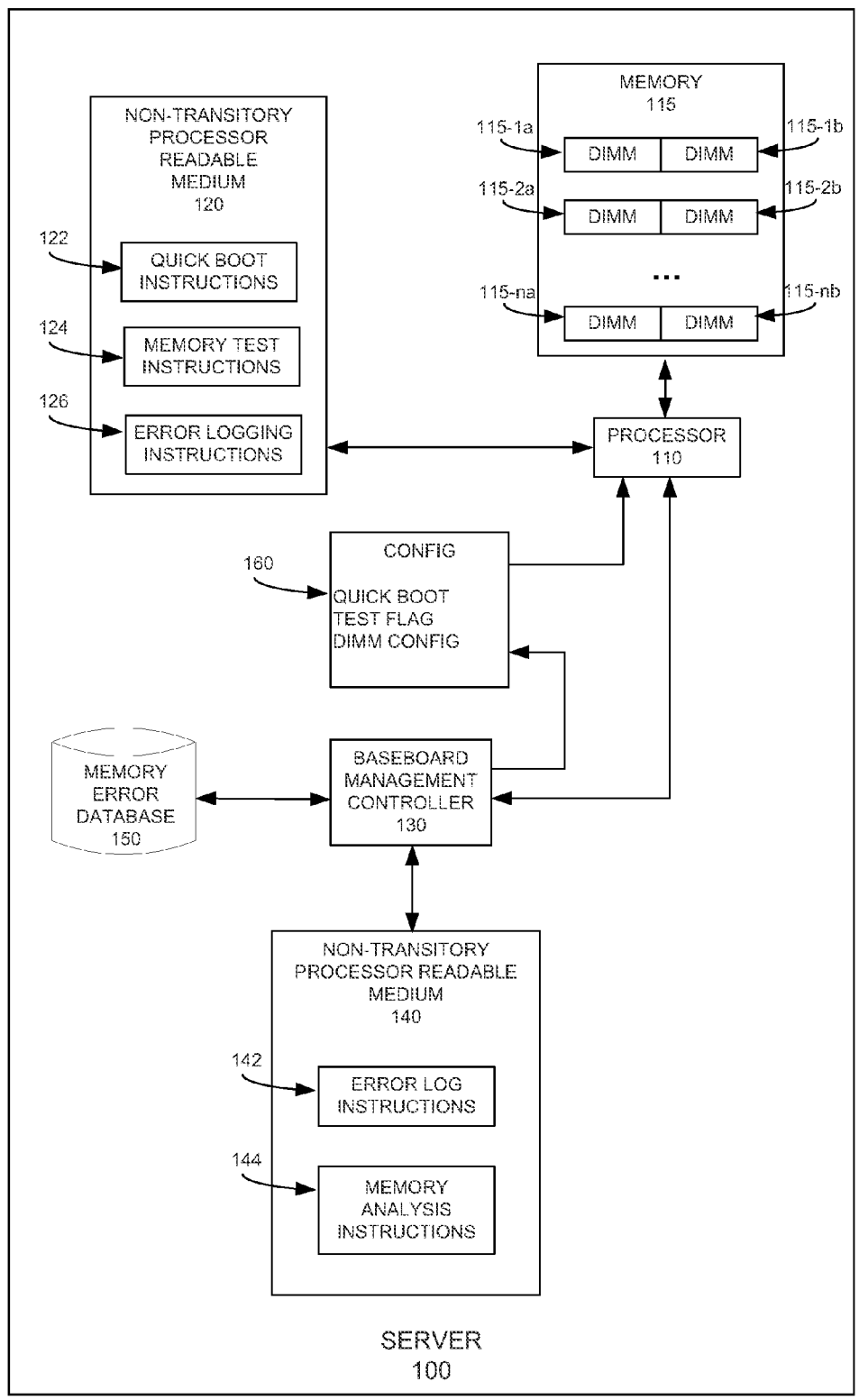
FIG. 1 is an example of a server that may implement the memory module identification techniques described herein.

FIG. 1 is an example of a server that may implement the memory module identification techniques described herein. Server 100 may be any type of computing apparatus, although the techniques described herein may typically be used on server computers, which tend to be high power computers that may support multiple users. However, it should be understood that even though the techniques described herein are in terms of a server computer, the techniques are applicable to any type of device which includes paired memory modules. Server 100 may include processor 110. Processor 110 may be coupled to non-transitory processor readable medium 120. The medium 120 may contain instructions thereon, which when executed by the processor cause the processor to implement the techniques described herein.

Processor 110 may be coupled to memory 115. Memory 115 may include a plurality of memory modules 115-(1 ... n)(a,b). For example, memory modules 115-(1 ... n)(a,b) may be dual inline memory modules (DIMM). In a server, memory modules are typically configured in pairs. Thus, modules 115-1(a,b) form a pair, and so on. When a correctable error is detected by the processor, typical error correction and detection algorithms allow for identification of the specific memory module that cause the error. However, for uncorrectable errors, identification is typically limited to the identifying the pair of memory modules that produced the uncorrectable error. In addition, some hardware architectures allow pairs of memory modules to operate in lockstep or non-lockstep mode. Although diagnostics tests described below may be able to identify the individual memory module from a pair of memory modules, such tests typically work better in non-lock step mode. Use of non-lockstep mode is described in further detail below.

Medium 120 may include quick boot instructions 122. The quick boot instructions may be instructions that cause the processor to boot with a reduced set of functionality. In particular, the quick boot instructions may allow the server to boot with minimal capabilities, such as testing memory. The medium may also include memory test instructions 124. Memory test instructions may be instructions that allow the processor to execute diagnostic tests on the memory. These tests may be exhaustive, chip level tests or signal integrity tests, that may be able to detect chip errors or signal integrity issues at the lowest level. In many cases, the diagnostic tests may be provided by the manufacturer of the memory that is included on a memory module, and is intended to test the functionality of the memory at the lowest level possible. A tradeoff however is that such testing may take a significant amount of time. As such, it may not be possible to run such diagnostic tests on every memory module at every boot, because the time used for the testing may be unacceptably long. The medium may also include error logging instructions 126. When a memory error, either correctable or uncorrectable, is received by the processor 110, the processor may log the error for later use, as will be described below.

The server may also include a Baseboard Management Controller (BMC) 130. A BMC may be a service processor that is coupled to the processor 110. The BMC may also be coupled to a non-transitory processor readable medium 140. The medium 140 may contain thereon a set of instructions, which when executed by the BMC cause the BMC to implement the techniques described herein. For example, the instructions may include error logging instructions 142. The error logging instructions may cause the BMC to receive a memory error indication, either correctable or uncorrectable, from the processor 110, and store that error in a memory error database 150. The history of error may be retrieved and utilized to determine faulty memory modules, as will be described below.

The medium 140 may also include memory analysis instructions 144. The memory analysis instructions may cause the BMC to receive memory errors from the processor 110, and instruct the processor to conduct diagnostic tests on the memory 115, to determine memory modules that should be replaced. The server 100 may also include configuration store 160. Configuration store 160 may be non-volatile memory accessible by both the processor and BMC that may be used to exchange information, as will be described in further detail below.

In operation, server 100 may be executing a workload. As the workload is being executed, correctable memory errors may be detected and corrected by the processor 110. Using the error logging instructions 126, the processor may inform the BMC 130 of the correctable error. The BMC, using the error log instructions 142, may log the correctable error to the memory error database 150. Typically, it can be determined which memory module of a pair of memory modules was the cause for a correctable error.

At some point, the processor may receive an indication of an uncorrectable memory error. In such a case, the server cannot continue, and must reboot. However, it may be desirable to first identify the specific memory module that was the cause of the uncorrectable error. The processor may inform the BMC of an uncorrectable memory error and include identification of the pair of memory modules from which the error occurred. The BMC may then de-configure all other memory modules by altering the configuration status in the configuration store 160. The BMC may also set a quick boot test flag indicating a memory test in the configuration store. The use of the flags is described in further detail below.

The BMC may then instruct the server to reboot. When the server reboots, the configuration store 160 may be examined to determine that the server should perform a quick boot based on the quick boot flag. As explained above, a quick boot is a limited boot process, that only enables the server to perform memory tests. In addition, the server may only configure memory modules that are indicated as configured in the configuration store. As mentioned above, all memory modules that are not the source of the uncorrected error were de-configured. Thus, the server may only operate on memory modules that are the potential source of the uncorrected error.

The server may then execute exhaustive memory tests on the memory modules that remain configured. For example, the exhaustive memory tests may be performed by executing the memory test instructions 124. The memory test instructions are not limited to any particular type of memory tests. Manufacturers of memory chips that make up memory modules include test routines that may determine any errors being introduced by the chips. Although these tests may determine specific errors on specific chips, the tests may take a long time to run. It would not be practical to run these exhaustive tests on all memory modules within a server upon every boot.

The techniques described herein avoid this problem by running the memory module diagnostic tests only when the quick boot flag is set indicating a memory test. Thus, the memory diagnostics tests are not run during normal boots. Furthermore, memory modules that have been determined to not be the source of memory error are de-configured. Thus, no time is wasted in running the tests on memory modules that are not the source of the error. Finally, the server may use a quick boot that only initializes the functionality needed to run the memory test. Thus, no time is wasted in initializing unneeded functionality.

After the memory diagnostic tests are complete, the server may be able to determine which memory module of the pair of memory modules was the cause of the uncorrected error. If so, the results may be sent to the BMC. The BMC may be able to look at the test results and using 140, determine the FRU that caused the uncorrected error. In some cases, the diagnostic tests may root cause the uncorrected error to bad traces or failed components on mother board that would require replacement of mother board rather than the memory modules. The BMC may record the memory module or the mother board that caused the uncorrected error in the database 150. In addition, the BMC may de-configure the pair of memory modules in the configuration store. The identified faulty module may be indicated as faulty, while its pair may be indicated as having a non-operational pair. In addition, the BMC may then reconfigure the memory modules that did not produce errors and were de-configured above. The quick boot flag may also be cleared. Thus, at the end of the test operation, memory modules that have an error (or have a pair with an error) are de-configured, and those that do not have an error are re-configured. The BMC may then send a notification which identifies the failed memory module. For example, assume an uncorrected error occurred in DIMM pair 115-2(a,b). The diagnostic tests may have isolated the failing DIMM as 115-2(a). Thus the technician could be given a notification to replace DIMM 115-2(a).

The server may then be instructed by the BMC to reboot. Because the pair of memory modules that caused the uncorrected error is de-configured, there is no concern that that memory module pair will generate additional uncorrectable errors.

In some cases, the memory diagnostic tests may not be able to identify the specific memory module that is causing the error. For example, in the case of an intermittent error, the memory module may not exhibit the error when the diagnostic tests are run. In such cases, the BMC may retrieve the error history of each memory module in the pair from the database 150. If the history indicates numerous corrections of errors on one memory module of the pair, and no or few corrections on the other, then an inference may be made that the module with numerous errors may be failing. The technician may be given an indication of which memory module is suspected of being faulty with a degree of probability based on the error history in the database. The technician may then replace either the suspected faulty memory module or both memory modules.

It should be noted that although the BMC is described above as being integrated with the server 100, this was for purposes of explanation only. In other implementations, the functionality provided by the BMC, including error logging and memory analysis may be performed by a processor that is external to the server. For example, the memory analysis functions may be included on a standalone computer that may provide the functionalities for one or more servers.

Figure 2:
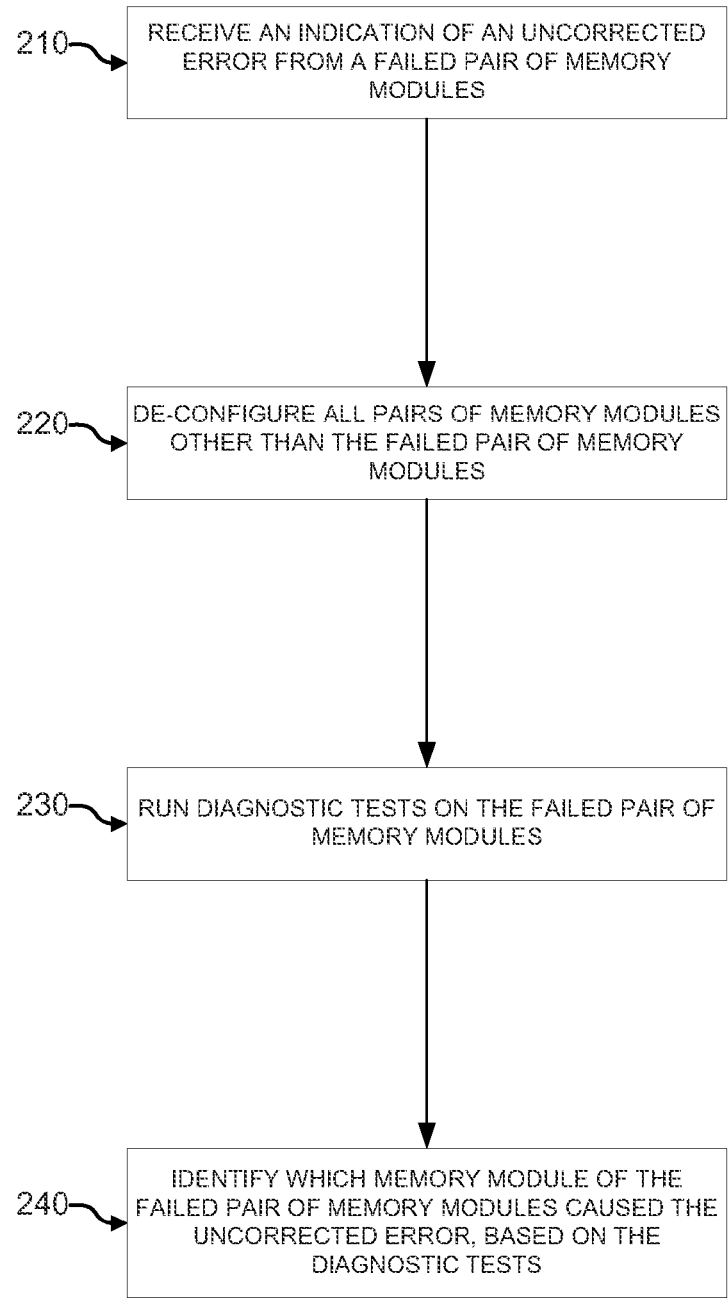
FIG. 2 is an example of a high level flow diagram for identifying a memory module that may be causing uncorrected errors according to the techniques described herein.

FIG. 2 is an example of a high level flow diagram for identifying a memory module that may be causing uncorrected errors according to the techniques described herein. In block 210, an indication of an uncorrected error may be received form a pair of memory modules. As explained above, when an uncorrected error occurs, the error does not identify the specific DIMM that was the source of the error. Rather the error specifies the paired set of DIMMs. In block 220, all pairs of memory modules, other than the failed pair of memory modules, may be de-configured. Because exhaustive memory tests are not performed on de-configured memory modules, the overall time to perform the exhaustive diagnostic tests may be reduced.

In block 230, diagnostic tests may be run on the failed pair of memory modules. As explained above, the diagnostic tests that are run may be exhaustive diagnostic tests that are designed to exercise every piece of functionality of the memory chips that make up the DIMM. These exhaustive diagnostic tests may be able to specifically identify which DIMM caused the uncorrected error reported in block 210. In block 240, the memory module of the failed pair of memory modules that caused the uncorrected error may be identified based on the diagnostic tests. In other words, the exhaustive diagnostics tests may be able to identify which module of the pair of modules was responsible for the uncorrected memory error.

Figure 3:
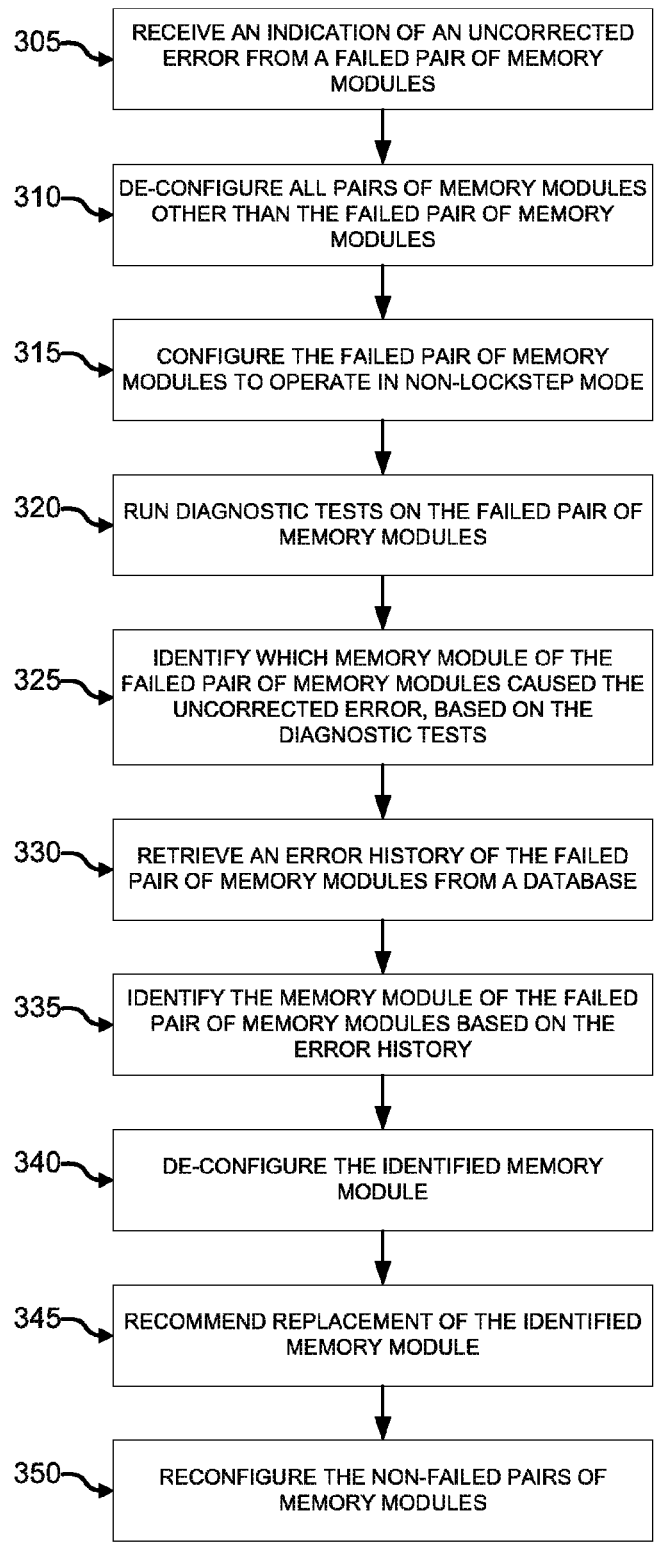
FIG. 3 is another example of a high level flow diagram for identifying a memory module that may be causing uncorrected errors according to the techniques described herein.

FIG. 3 is another example of a high level flow diagram for identifying a memory module that may be causing uncorrected errors according to the techniques described herein. In block 305, an indication of an uncorrected error from a failed pair of memory modules may be received. In block 310, memory modules other than the failed pair of memory modules may be de-configured. In block 315, the failed pair of memory modules may be configured to operate in non-lockstep mode. As mentioned above, detection of an error on an individual DIMM is easier if the DIMM is not operating in lock step mode. If the server is capable of operating in non-lockstep mode, the DIMMs may be configured to operate in non-lockstep mode.

In block 320, diagnostic tests may be run on the failed pair of memory modules. In block 325, the memory module of the faded pair of memory modules which caused the uncorrectable error may be identified based on the diagnostic tests. In block 330, an error history of the pair of memory modules may be retrieved form a database. In block 335, the memory module may be identified based on the error history. Typically, the error history may be used to identify the memory module that caused the error when the diagnostic tests were unable to conclusively identify the memory module including the fault.

In block 340, the identified memory module may be de-configured. In other words, the memory module that is identified as being faulty is removed from service, such that the server no longer attempts to use that memory module. It should be understood that the corresponding memory module of the pair, even though fault free, may be unusable until its mate is replaced.

In block 345, replacement of the identified memory module may be recommended. Based on the additional diagnostic tests, the technician may replace only the failed memory module, as opposed to both memory modules in the pair. In block 350, the non-failed pairs of memory modules may be reconfigured. In other words, the memory modules de-configured in step 310 may now be reconfigured. The server may then be rebooted, and only memory modules not exhibiting uncorrectable errors would be configured.

Figure 4:
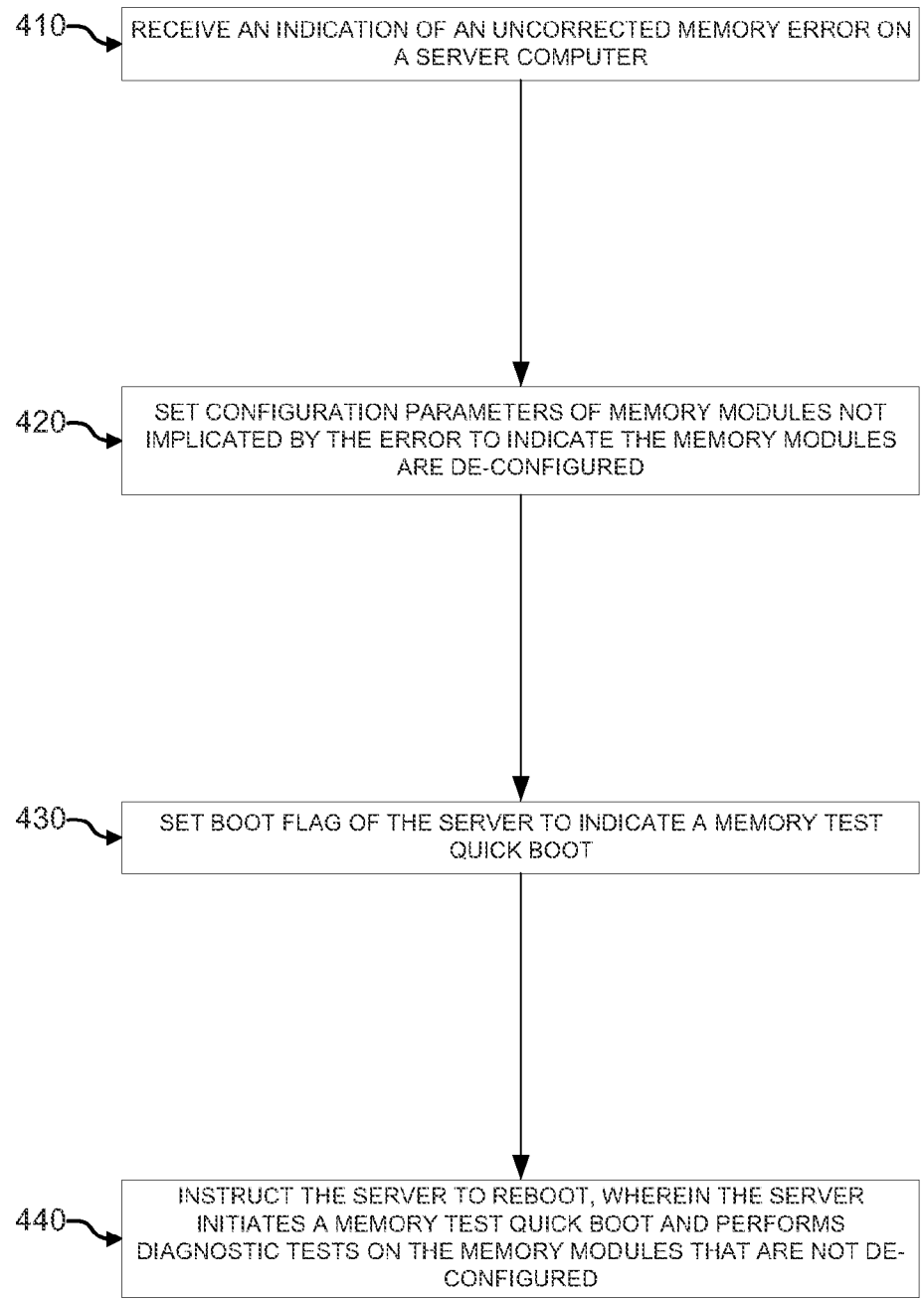
FIG. 4 is an example of a high level flow diagram for identifying failed memory modules through a quick boot.

FIG. 4 is an example of a high level flow diagram for identifying failed memory modules through a quick boot. In block 410, an indication of an uncorrected memory error on a server computer may be received. In block 420, the configuration parameters of memory modules not implicated by the error may be set to indicate the memory modules are de-configured. In other words, fault free memory modules are temporarily disabled.

In block 430, a boot flag on the server may be set to indicate a memory test quick boot. As explained above, a memory test quick boot is a shortened boot process that only executes the portions of the boot process that are needed to execute memory tests. All other portions of the boot process are omitted. In block 440, the server may be instructed to reboot, wherein the server initiates a memory test quick boot and performs diagnostic tests on the memory modules that are not de-configured. In other words, the server is instructed to reboot in a quick boot mode to test the memory modules, and those memory modules that have the potential of being the cause of an uncorrected error remain configured. Memory modules that are operating properly need not be subjected to the diagnostic tests.

Figure 5:
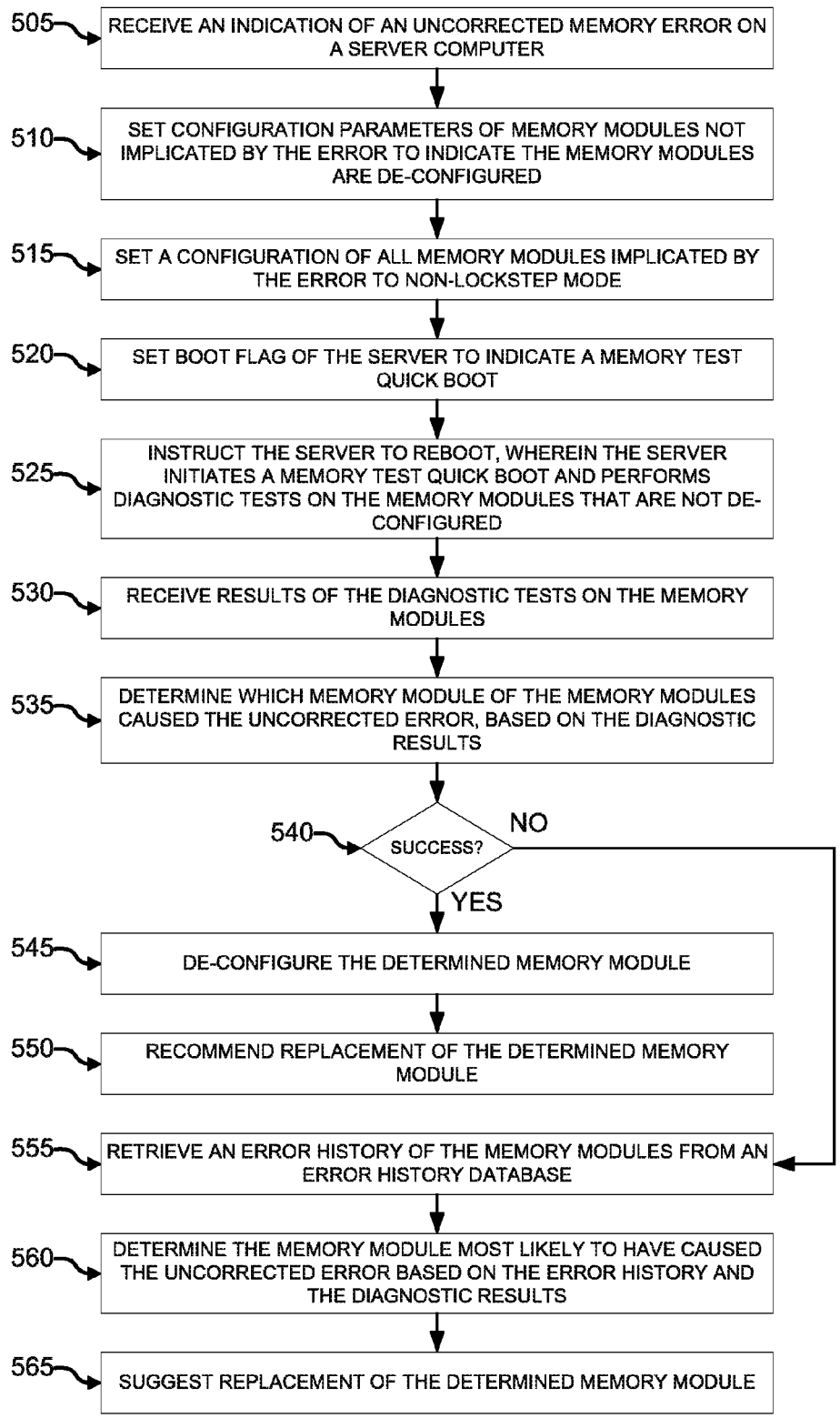
FIG. 5 is another example of a high level flow diagram for identifying failed memory modules through a quick boot.

FIG. 5 is another example of a high level flow diagram for identifying failed memory modules through a quick boot. In block 505 an indication of an uncorrected memory error on a server computer may be received. In block 510, configuration parameters of memory modules not implicated by the error may be set to indicate the memory modules are de-configured. In block 515 configuration of all memory modules implicated by the error may be set to indicate non-lockstep mode operation. As explained above, this step may occur if the server supports non-lockstep mode.

In block 520, a boot flag may be set to indicate a memory test quick boot. In block 525, the server may be instructed to reboot, wherein the server initiates a memory test quick boot and performs diagnostic tests on the memory modules that are not de-configured. In block 530, results of the diagnostic tests may be received. In block 535, it may be determined which memory module of the memory modules caused the uncorrected error, based on the diagnostic results.

In block 540, it may be determined if identifying the memory module in block 535 was a success. As mentioned above, in some cases, even the diagnostic tests may not definitively determine a faulty memory module. If the determination was a success, the process moves to block 545. In block 545, the faulty memory module may be de-configured. In block 550, replacement of the determined memory module may be recommended.

If the memory module was not successfully determined in block 540, the process moves to block 555. In block 555, an error history of the memory modules may be retrieved from an error history database. In block 560, the memory module most likely to have caused the uncorrected error may be determined based on the error history and the diagnostic results. In bock 565, replacement of the determined memory module may be suggested.

We claim:

1. A method comprising:
receiving an indication of an uncorrected error from a failed pair of memory modules;

de-configuring all pairs of memory modules other than the failed pair of memory modules;
running diagnostic tests on the failed pair of memory modules; and
identifying which memory module of the failed pair of memory modules caused the uncorrected error, based on the diagnostic tests.

2. The method of claim 1 further comprising:
configuring the failed pair of memory modules to operate in non-lockstep mode.

3. The method of claim 1 further comprising:
retrieving an error history of the failed pair of memory modules from a database; and
identifying the memory module of the failed pair of memory modules based on the error history.

4. The method of claim 1 wherein the diagnostic tests are exhaustive diagnostic tests.

5. The method of claim 1 further comprising:
recommending replacement of the identified memory module; and
de-configuring the identified memory module.

6. The method of claim 5 further comprising:
reconfiguring all pairs of memory modules other than the failed pair of memory modules.

7. A non-transitory processor readable medium containing instructions thereon which when executed by a processor cause the processor to:
receive an indication of an uncorrected memory error on a server computer, wherein the indication implicates a plurality of memory modules as a potential source of the uncorrected memory error;
set configuration parameters of memory modules not implicated by the uncorrected memory error to indicate the memory modules are de-configured;
set boot flag of the server to indicate a memory test quick boot; and
instruct the server to reboot, wherein the server initiates a memory test quick boot and performs diagnostic tests on the memory modules that are not de-configured.

8. The medium of claim 7 further comprising instructions to:
set a configuration of all memory modules implicated by the uncorrected memory error to non-lockstep mode.

9. The medium of claim 7 further comprising instructions to:
receive results of the diagnostic tests on the memory modules;
determine which memory module of the memory modules caused the uncorrected memory error, based on the diagnostic results;
de-configure the determined memory module; and
recommend replacement of the determined memory module.

10. The medium of claim 7 further comprising instructions to:
retrieve an error history of the memory modules from an error history database;
determine the memory module most likely to have caused the uncorrected memory error based on the error history and the diagnostic results; and
suggest replacement of the determined memory module.

11. The medium of claim 7 wherein the processor is a baseboard management controller integrated within the server.

12. The medium of claim 7 wherein the processor is external to the server.

13. A system comprising:
a plurality of memory modules including a failed pair of memory modules;
a processor coupled to the plurality of memory modules and a management processor, wherein
the management processor:
receives an indication of an uncorrected error from the failed pair of memory modules; and
de-configures all pairs of memory modules other than the failed pair of memory modules;
wherein the processor performs a diagnostic test on the failed pair of memory modules; wherein
based on the diagnostic test performed by the processor, the management processor:
identifies a memory module between the failed pair of memory modules producing the uncorrected error; and
recommends replacement of the identified memory module between the failed pair of memory modules.

14. The system of claim 13 wherein the management processor further:
causes the processor to reboot and execute the diagnostic test; and
receives results of the diagnostic test.

15. The system of claim 14 wherein the management processor further:
retrieves a memory module error history; and
identifies the memory module between the failed pair of memory modules causing the uncorrected error based on the memory module error history and the diagnostic test results.

* * * * *